(12) United States Patent
Lee et al.

(10) Patent No.: US 11,963,394 B2
(45) Date of Patent: Apr. 16, 2024

(54) DISPLAY DEVICE AND OPTICAL INSPECTION METHOD FOR THE SAME

(71) Applicant: SAMSUNG DISPLAY CO., LTD., Yongin-si (KR)

(72) Inventors: Hee Young Lee, Yongin-si (KR); Eun Mi Seo, Yongin-si (KR); Gil Yeong Park, Yongin-si (KR); Min Ju Oh, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 18/369,313

(22) Filed: Sep. 18, 2023

(65) Prior Publication Data
US 2024/0008305 A1    Jan. 4, 2024

Related U.S. Application Data

(62) Division of application No. 17/227,674, filed on Apr. 12, 2021, now Pat. No. 11,812,637.

(30) Foreign Application Priority Data

Sep. 8, 2020    (KR) ......................... 10-2020-0114950

(51) Int. Cl.
*H10K 50/86*    (2023.01)
*G01J 1/04*    (2006.01)
(Continued)

(52) U.S. Cl.
CPC ............ *H10K 50/86* (2023.02); *G01J 1/0429* (2013.01); *G01J 1/42* (2013.01); *H10K 59/12* (2023.02);
(Continued)

(58) Field of Classification Search
CPC ...... H10K 50/844; H10K 59/50; H10K 71/70; H10K 71/00; H10K 59/12; H10K 50/86;
(Continued)

(56) References Cited

U.S. PATENT DOCUMENTS

| | | | | |
|---|---|---|---|---|
| 2009/0115958 A1* | 5/2009 | Kurihara | ............. | G02F 1/13718 349/179 |
| 2018/0120490 A1* | 5/2018 | Hwang | ................ | G02B 5/3025 |
| 2021/0009469 A1* | 1/2021 | Marshall | ................ | C03C 17/30 |

FOREIGN PATENT DOCUMENTS

| | | |
|---|---|---|
| KR | 100467513 B1 | 9/2005 |
| KR | 100994634 B1 | 11/2010 |

* cited by examiner

*Primary Examiner* — Mariam Qureshi
(74) *Attorney, Agent, or Firm* — CANTOR COLBURN LLP

(57) ABSTRACT

A display device includes: a substrate; a display element layer disposed on the substrate, where the display element layer includes a light emitting element which emits light; a polarizing film disposed on the display element layer, where the polarizing film includes a first polarizer having a first absorption axis extending to a first direction and a first transmission axis extending to a second direction orthogonal to the first direction; and a first layer disposed on one surface of the polarizing film, where the first layer has a first phase difference. Light emitted from the display element layer has a polarizing axis, and an angle between the polarizing axis and one of the first absorption axis and the first transmission axis is in a range of about 25 degrees to about 65 degrees.

2 Claims, 13 Drawing Sheets

(51) Int. Cl.
    *G01J 1/42*         (2006.01)
    *H10K 59/12*      (2023.01)
    *H10K 71/00*      (2023.01)
    *H10K 71/70*      (2023.01)
    *G02B 5/30*       (2006.01)

(52) U.S. Cl.
    CPC ............ *H10K 71/00* (2023.02); *H10K 71/70* (2023.02); *G01J 2001/4247* (2013.01); *G01J 2001/4252* (2013.01); *G02B 5/3025* (2013.01)

(58) Field of Classification Search
    CPC ................ G01J 4/00; G01J 2001/4252; G01J 2001/4247; G01J 1/42; G01J 1/0429; G01N 21/21; G02B 5/3025
    See application file for complete search history.

DISPLAY DEVICE AND OPTICAL INSPECTION METHOD FOR THE SAME

This application is a divisional of U.S. patent application Ser. No. 17/227,674, filed on Apr. 12, 2021, which claims priority to Korean patent application 10-2020-0114950, filed on Sep. 8, 2020, and all the benefits accruing therefrom under 35 U.S.C. § 119, the content of which in its entirety is herein incorporated by reference.

BACKGROUND

1. Field

The disclosure generally relates to a display device and an optical inspection method for inspecting the display device, and more particularly, to a display device or an optical inspection device, in which a phase difference of a layer included therein is predetermined, and an optical inspection method for inspecting the display device.

2. Description of the Related Art

Recently, a method of stacking a multi-layer film on a display panel of a display device has been used to improve mechanical characteristics of the display device.

However, in such a display device where the multi-layer film is provided on a display panel thereof, a phenomenon in which optical characteristics are deteriorated due to distortion of optical information provided from the display panel (color deviation occurrence, etc.) may occur. In particular, when optical performance of the display device is tested, it may be difficult to clearly measure performance of the display device due to such a phenomenon.

SUMMARY

Embodiments provide a display device configured to improve reliability of optical information thereof and an optical inspection method for inspecting the display device.

In accordance with an embodiment of the disclosure, a display device includes: a substrate; a display element layer disposed on the substrate, where the display element layer includes a light emitting element which emits light; a polarizing film disposed on the display element layer, where the polarizing film includes a first polarizer having a first absorption axis extending to a first direction and a first transmission axis extending to a second direction orthogonal to the first direction; and a first layer disposed on one surface of the polarizing film, where the first layer has a first phase difference. In such an embodiment, light emitted from the display element layer has a polarizing axis, and an angle between the polarizing axis and one of the first absorption axis and the first transmission axis is in a range of about 25 degrees to about 65 degrees.

In an embodiment, the first phase difference may be about 10 nanometers (nm) or less.

In an embodiment, the first phase difference may be equal to or greater than about 110 nm and equal to or less than about 160 nm.

In an embodiment, the first phase difference may be about 4000 nm or greater.

In an embodiment, the angel between the polarizing axis and the one of the first absorption axis and the first transmission axis may be about 45 degrees.

In an embodiment, the first layer may include a plurality of layers, and the first phase difference may be a total sum of phase differences of the plurality of layers.

In an embodiment, the first layer may include: a first first layer disposed on the polarizing film, where the first first layer may have a first first phase difference; a second first layer disposed on the first first layer, where the second first layer may have a second first phase difference; and a third first layer disposed on the second first layer, where the third first layer may have a third first phase difference. In such an embodiment, the first phase difference may be a sum of the first first phase difference, the second first phase difference, and the third first phase difference.

In an embodiment, the display device may further include a second layer disposed on an opposing surface of the polarizing film, where the second layer may have a second phase difference.

In an embodiment, a sum of the first phase difference and the second phase difference may be about 10 nanometers (nm) or less.

In an embodiment, a sum of the first phase difference and the second phase difference may be equal to or greater than about 110 nm and equal to or less than about 160 nm.

In an embodiment, a sum of the first phase difference and the second phase difference may be about 4000 nm or greater.

In an embodiment, the light emitting element may include at least one selected from an organic light emitting element, an inorganic light emitting element, and a light emitting element including a combination of an organic material and an inorganic material.

In accordance with an embodiment of the disclosure, an optical inspection method of the display device includes: preparing an optical inspection device which receives light provided from the display device; locating the optical inspection device on a front surface of the display device; and acquiring optical information of the display device, based on light provided from the display device.

In an embodiment, the optical inspection device may be a camera device.

In an embodiment, the optical inspection device may include: an optical sensor part which receives light provided thereto, where the optical sensor part may acquire electrical information, based on information on the light provided thereto; a lens part which receives light provided from an outside, where the lens part may provide the optical sensor part with the light provided from the outside; and a polarizing part having a second absorption axis and a second transmission axis.

In an embodiment, the optical inspection device may further include a phase film part having a phase difference of about 4000 nm or greater.

In an embodiment, the optical sensor part may include a second polarizer having a predetermined polarizing axis. In such an embodiment, an angle between the predetermined polarizing axis and one of the second absorption axis and the second transmission axis may be in a range of about 25 degrees to about 65 degrees.

In an embodiment, the locating the locating the optical inspection device on the front surface of the display device may include locating the optical inspection device at the front of the display device in a way such that a reference display line of the display device and a reference light receiving line of the optical inspection device form an angle of about 45 degrees. In such an embodiment, the reference display line may be perpendicular to a display surface of the display device, and the reference light receiving line may be perpendicular to a main surface of the optical inspection device.

In accordance with an embodiment of the disclosure, an optical inspection method includes: preparing a display device including a light emitting element which emits light, where the display device outputs the light in a display direction; preparing an optical inspection device which receives the light output from the display device; locating the optical inspection device on a front surface of the display device; and acquiring optical information of the display device, based on the light provided from the display device. In such an embodiment, the optical inspection device includes: a main body including a light receiving part which receives light provided thereto, where the light receiving part includes a polarizer having a predetermined polarizing axis, and an image processor which acquires electrical information, based on the light provided to the light receiving part; a lens part which receives light provided from an outside, where the lens part provides the light provided from the outside to the light receiving part; and a phase film part having a phase difference of about 4000 nm. In such an embodiment, the optical inspection device includes a polarizing part having an absorption axis and a transmission axis, and an angle between the predetermined polarizing axis and one of the absorption axis and the transmission axis is in a range of about 25 degrees to about 65 degrees.

In an embodiment, the locating the optical inspection device on the front surface of the display device may include locating the optical inspection device at the front of the display device in a way such that a reference display line of the display device and a reference light receiving line of the optical inspection device form an angle of about 45 degrees. In such an embodiment, the reference display line may be perpendicular to a display surface of the display device, and the reference light receiving line may be perpendicular to a main surface of the optical inspection device.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
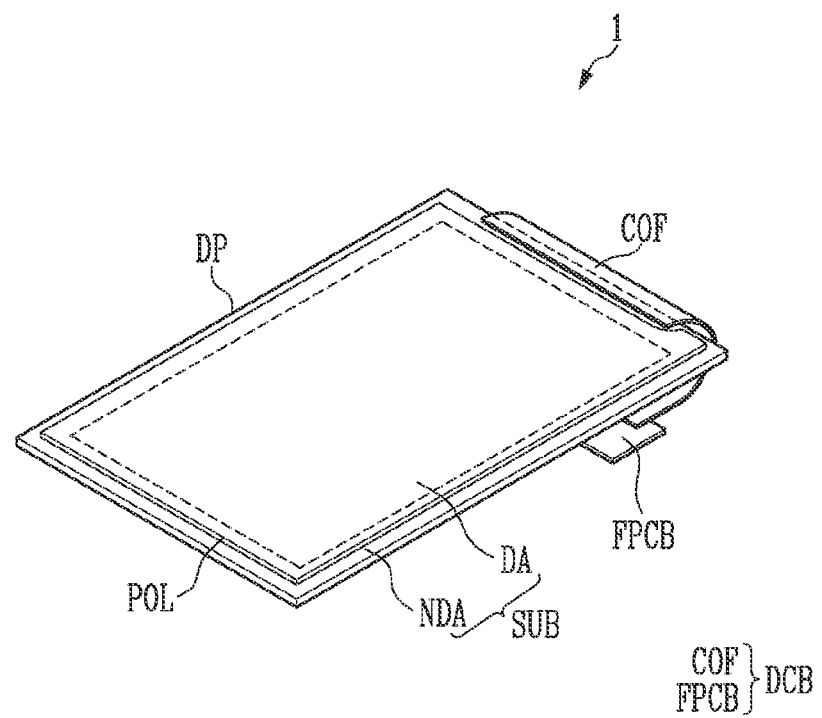
FIG. 1 is a perspective view illustrating a display device in accordance with an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In the drawing figures, dimensions may be exaggerated for clarity of illustration. It will be understood that when an element is referred to as being "between" two elements, it can be the only element between the two elements, or one or more intervening elements may also be present.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The disclosure generally relates to a display device and an optical inspection method for the display device, and more particularly, to a display device or an optical inspection device in which the phase difference of a layer included in the display device is adjusted, and an optical inspection method for the display device.

Hereinafter, embodiments of a display device and an optical inspection method for the display device in accordance with the disclosure will be described in detail with reference to FIGS. 1 to 13.

Figure 2:
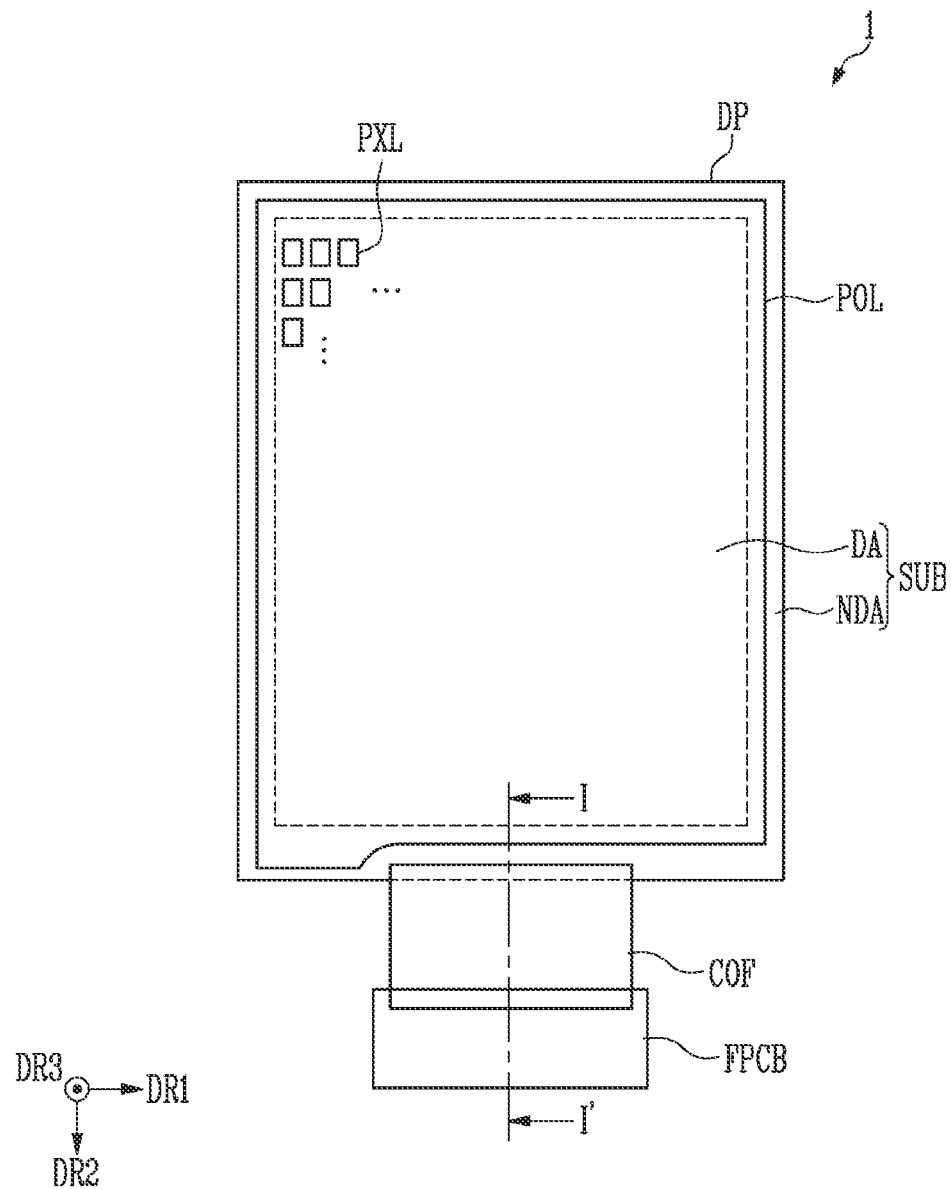
FIG. 2 is a plan view illustrating the display device shown in FIG. 1.
Figure 3:
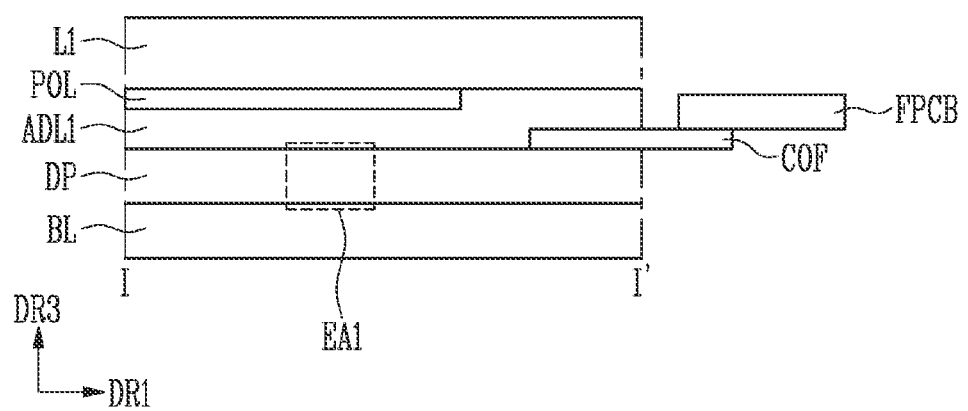
FIGS. 3 and 4 are sectional views taken along line I-I' shown in FIG. 2.
Figure 4:
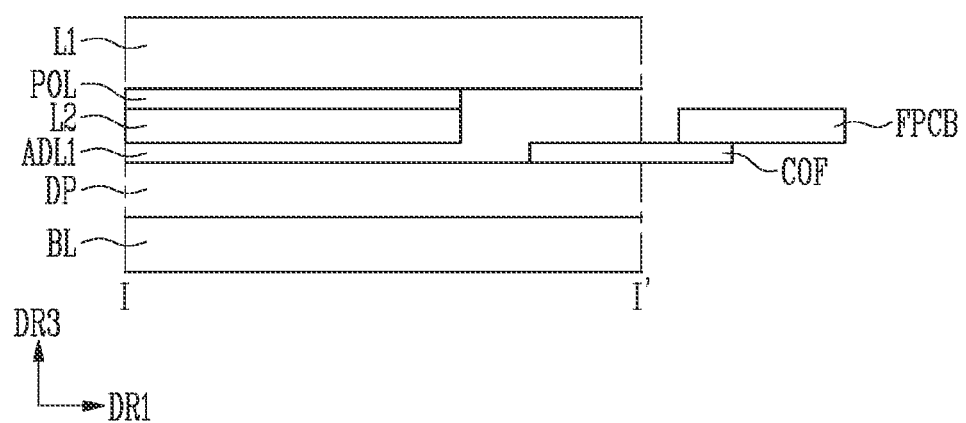

FIG. 1 is a perspective view illustrating a display device in accordance with an embodiment of the disclosure. FIG. 2 is a plan view illustrating the display device shown in FIG. 1. FIGS. 3 and 4 are sectional views taken along line I-I' shown in FIG. 2.

An embodiment of the display device 1 may be a device capable of providing visual data to a user. In an embodiment, the display device 1 may be a smart phone, a tablet personal computer ("PC"), a large screen device, a mobile phone, a video phone, an electronic book reader, a desktop PC, a laptop PC, a netbook computer, a workstation, a server, a personal digital assistant ("PDA"), a portable multimedia player ("PMP"), an MP3 player, a medical appliance, a camera, or a wearable device. However, the disclosure is not limited to a specific example.

In accordance with an embodiment, the display device 1 may be a flexible device. The display device 1 may be a bendable type device, a foldable type device, or a rollable type device, but the disclosure is not limited thereto.

Referring to FIGS. 1 to 4, an embodiment of the display device 1 may include a display panel DP, a driving circuit board DCB, and a polarizing film POL.

The display panel DP may include a substrate SUB, pixels PXL, a driving unit, and a line unit. The driving unit may include a scan driver, an emission driver, and a data driver.

The substrate SUB may include a rigid material or a flexible material according to the purpose of the display device 1. However, the material of the substrate SUB is not limited to a specific example.

The substrate SUB may include a display area DA and a non-display area NDA.

Light may be emitted in the display area DA. The light may not be emitted in the non-display area NDA.

The pixel PXL may be located on the substrate SUB. The pixel PXL may be located in the display area DA. Light may be emitted in a third direction DR3 in the display area DA. Here, the third direction DR3 may be a thickness direction of the substrate SUB. The pixels PXL may be arranged in a matrix form along rows extending in a first direction DR1 and columns extending in a second direction DR2.

The pixel PXL may include a light emitting element (see 'LD' shown in FIG. 6) configured to emit light when an electrical signal is applied thereto.

The driving unit may be located in the non-display area NDA when viewed on a plane or when viewed from a plan view in the third direction DR3. At least one selected from the scan driver, the emission driver, and the data driver may be located together with the line unit in the non-display area NDA. In accordance with an embodiment, the driving unit may be disposed in the display panel DP. Alternatively, the driving unit may be mounted on the driving circuit board DCB, and the position of the driving unit is not limited to a specific example.

The driving unit may output electrical information or signal provided to the pixel PXL. When electrical information is provided to the pixel PXL, the light emitting element LD included in the pixel PXL may emit light based on the electrical information.

The scan driver may provide a scan signal to the pixel PXL through a scan line. The emission driver may provide an emission control signal to the pixel PXL through an emission control line. The data driver may provide a data signal to the pixel PXL through a data line.

The line unit may be located in the non-display area NDA when viewed on a plane. The line unit may electrically connect the driving unit and the pixel PXL.

The driving circuit board DCB may include a chip-on-film COF and a flexible circuit board FPCB.

The chip-on-film COF may provide the display panel DP with an electrical signal generated based on a signal applied from the flexible circuit board FPCB.

One end of the chip-on-film COF may be attached to the display panel DP, and another end of the chip-on-film COF may be attached to the flexible circuit board FPCB. In an embodiment, at least a portion of the chip-on-film COF may be bent.

The chip-on-film COF may include an insulating film and a plurality of lines disposed on the insulating film. An insulating film provided as a thin film and in a form in which lines is disposed on the insulating film are commonly defined as the chip-on-film COF. The chip-on-film COF may also be replaced with a tape carrier package, a flexible printed circuit board, or the like. In the chip-on-film COF, although not shown in the drawings, a semiconductor chip connected to at least some of the lines may be further mounted on the insulating film.

A circuit element capable of processing an electrical signal to be applied to the display panel DP may be located on the flexible circuit board FPCB.

The flexible circuit board FPCB may be located on one surface or a rear surface of the display panel DP. One end portion of the flexible circuit board FPCB may be connected to the chip-on-film COF having a bent shape to be located on the rear surface of the display panel DP. Therefore, the flexible circuit board FPCB may not be viewed from a top plan view.

FIGS. 3 and 4 are sectional views taken along line I-I' shown in FIG. 2.

Referring to FIG. 3, an embodiment of the display device 1 may include a barrier layer BL, the display panel DP, the chip-on-film COF, the flexible circuit board FPCB, the polarizing film POL, a first adhesive ADL1, and a first layer L1.

Referring to FIG. 4, an embodiment of the display device 1 may further include a second layer L2.

The barrier layer BL may be located on the bottom of the display panel DP to protect the display panel DP. The barrier layer BL may include a lower protective film having a multi-layer structure in which single layers including an inorganic insulating material and/or an organic insulating material are stacked one on another. In an embodiment, the barrier layer BL may include a cushion layer including or made of an elastic material. The cushion layer is deformed by a force applied from the outside, and is restorable to an original state when the force applied from the outside is removed. The cushion layer may be defined by a sponge having elasticity, or the like, but the disclosure is not limited thereto.

The flexible circuit board FPCB and the display panel DP may be connected to each other by the chip-on-film COF. Referring to FIG. 3, the one end and another end of the chip-on-film COF may be respectively connected to the display panel DP and the flexible circuit board FPCB as described above. In an embodiment, a portion of the chip-on-film COF may be bent such that the flexible circuit board FPCB is located on the rear surface of the display panel DP.

The display panel DP may include the pixel PXL including the light emitting element LD. The display panel DP will be described in detail with reference to FIGS. 6 and 7.

Figure 6:
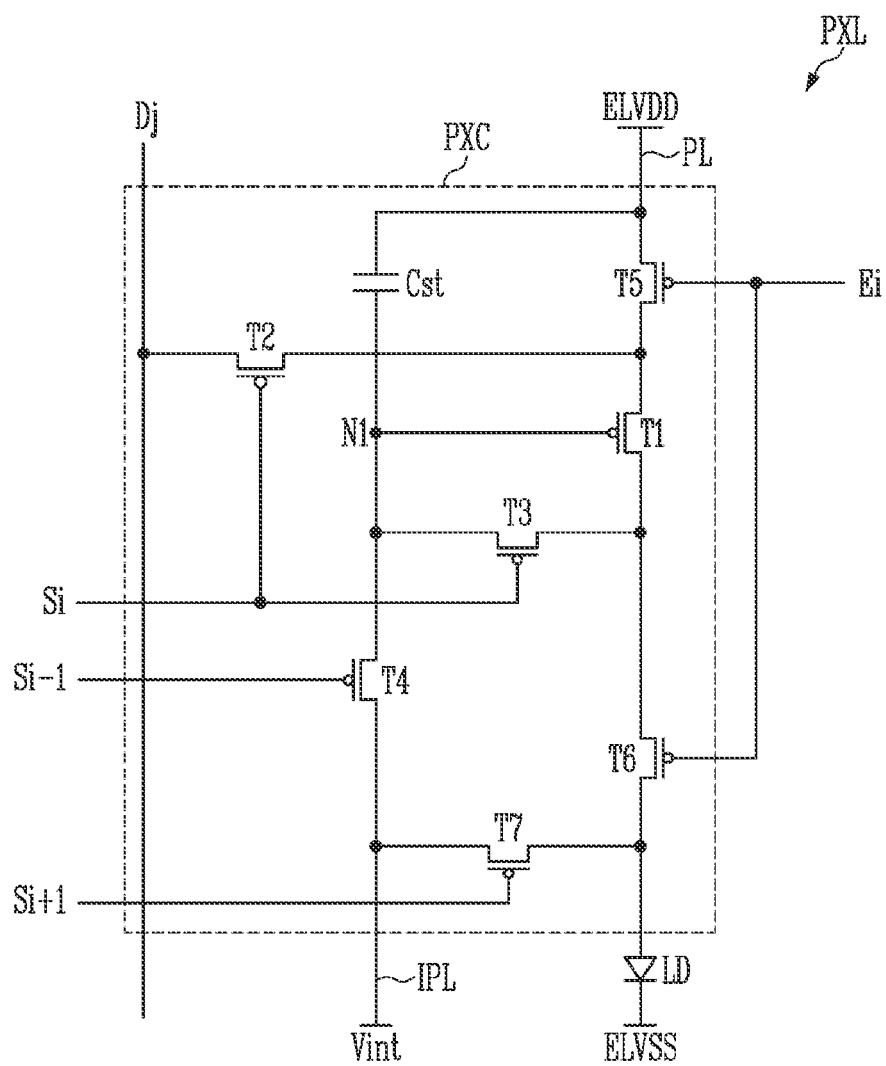
FIG. 6 is a view illustrating a pixel driving circuit of each pixel included in the display device in accordance with an embodiment of the disclosure.

FIG. 6 is a view illustrating a pixel driving circuit of each pixel included in the display device in accordance with an embodiment of the disclosure.

Each pixel included in an embodiment of the display device 1 may include a pixel driving circuit PXC.

The pixel driving circuit PXC may include first to seventh transistors T1 to T7 and a storage capacitor Cst. The pixel driving circuit PXC may be electrically connected to the light emitting element LD.

A first electrode of the first transistor T1 may be connected to a first power source ELVDD via the fifth transistor T5, and a second electrode of the first transistor T1 may be connected to an anode electrode of the light emitting element LD via the sixth transistor T6. The first transistor T1 may control a current flowing from the first power source ELVDD to a second power source ELVSS via the light emitting element LD, based on a voltage of a first node N1 connected to a gate electrode thereof. The first transistor T1 may be a driving transistor.

The second transistor T2 may be connected between the first electrode of the first transistor T1 and a j-th data line Dj. A gate electrode of the second transistor T2 may be connected to an i-th scan line Si. The second transistor T2 may be turned on when a scan signal is applied from the i-th scan line Si, and electrically connect the j-th data line Dj and the first electrode of the first transistor T1 to each other. The second transistor T2 may be a switching transistor.

The third transistor T3 may be connected between the second electrode of the first transistor T1 and the first node N1. The third transistor T3 may be turned on when the scan signal is applied from the i-th scan line Si, and electrically connect the second electrode of the first transistor T1 and the first node N1 to each other.

The fourth transistor T4 may be connected between the first node N1 and an initialization power line IPL to which an initialization power source Vint is applied. A gate electrode of the fourth transistor T4 may be connected to an (i−1)-th scan line Si−1. The fourth transistor T4 may be turned on when the scan signal is applied to the (i−1)-th scan line Si−1, to supply a voltage of the initialization power source Vint to the first node N1. The fourth transistor T4 may be an initialization transistor.

The fifth transistor T5 may be connected between a power line PL, to which the first power source ELVDD is applied, and the first transistor T1. A gate electrode of the fifth transistor T5 may be connected to an i-th emission control line Ei. The fifth transistor T5 may be turned off when an emission control signal having a gate-off voltage (e.g., a high level voltage) is applied thereto from the i-th emission control line Ei, and be turned on in other cases.

The sixth transistor T6 may be connected between the first transistor T1 and the light emitting element LD. A gate electrode of the sixth transistor T6 may be connected to the i-th emission control line Ei. The sixth transistor T6 may be turned off when the emission control signal having the gate-off voltage is applied from the i-th emission control line Ei, and be turned on in other cases.

The seventh transistor T7 may be connected between the initialization power line IPL and the anode electrode of the light emitting element LD. A gate electrode of the seventh transistor T7 may be connected to an (i+1)-th scan line Si+1. The seventh transistor T7 may be turned on when the scan signal is applied from the (i+1)-th scan line Si+1, to supply the voltage of the initialization power source Vint to the anode electrode of the light emitting element LD. FIG. 6 shows an embodiment where the gate electrode of the seventh transistor T7 is connected to the (i+1)-th scan line Si+1, but the disclosure is not limited thereto. In an alternative embodiment, the gate electrode of the seventh transistor T7 may be connected to the i-th scan line Si. In such an embodiment, the seventh transistor T7 is turned on by the scan signal applied from the i-th scan line Si.

The voltage of the initialization power source Vint may be set as a voltage lower than that of a data signal. In one embodiment, for example, the voltage of the initialization power source Vint may be set equal to or lower than an optimum voltage of the data signal.

The storage capacitor Cst may be connected between the power line PL, to which the first power source ELVDD is applied, and the first node N1. The storage capacitor Cst may store information on a voltage corresponding to the data signal and a threshold voltage of the first transistor T1.

The anode electrode of the light emitting element LD may be connected to the first transistor T1 via the sixth transistor T6. A cathode electrode of the light emitting element LD may be connected to the second power source ELVSS.

The light emitting element LD may emit light with a predetermined luminance corresponding to an amount of current supplied from the first transistor T1. A voltage value of the first power source ELVDD may be set higher than that of the second power source ELVSS such that a current may flow through the light emitting element LD.

The light emitting element LD may include an organic light emitting element or an inorganic light emitting element such as a micro light emitting element ("LED") or a quantum dot light emitting element. Alternatively, the light emitting element LD may include a combination of an organic material and an inorganic material.

In an embodiment, as shown in FIG. 6, the pixel PXL includes a single light emitting element LD. However, in an alternative embodiment, the pixel PXL may include a plurality of light emitting elements LD, and the plurality of light emitting elements LD may be connected in series, parallel or series-parallel to each other.

In an embodiment, as shown in FIG. 6, the pixel PXL may be driven by using the i-th scan line Si, the (i−1)-th scan line Si−1, and the (i+1)-th scan line Si+1, but the disclosure is not limited thereto. In an embodiment, the i-th scan line Si, the (i−1)-th scan line Si−1, and the (i+1)-th scan line Si+1 may be separate signal lines supplied with the scan signal from different scan drivers SDV.

Hereinafter, for convenience of description, embodiments where the light emitting element LD included in the display device 1 is an organic light emitting element OLED will be mainly described, but the kind of the light emitting element LD is not limited to a specific embodiment.

Figure 5:
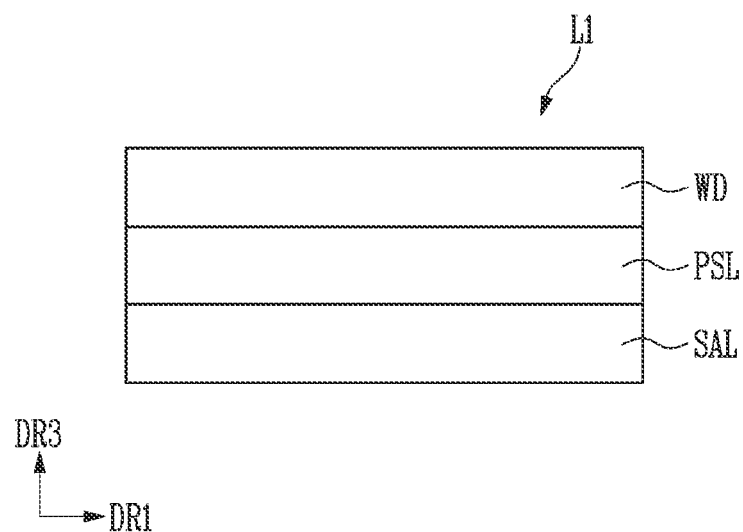
FIG. 5 is a sectional view illustrating a first layer in accordance with an embodiment of the disclosure.
Figure 7:
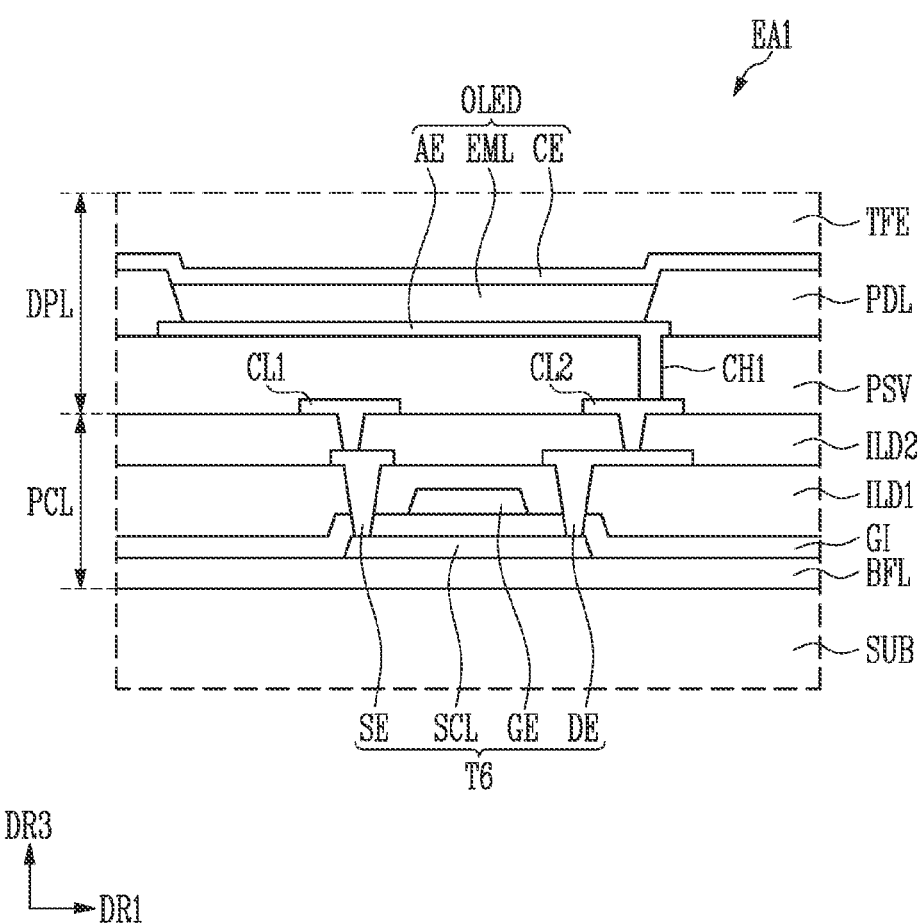
FIG. 7 is an enlarged view of area EA1 shown in FIG. 3.

FIG. 7 is an enlarged view of area EA1 shown in FIG. 3. FIG. 5 is a sectional view illustrating a first layer in accordance with an embodiment of the disclosure.

Hereinafter, only a section of a portion corresponding to the sixth transistor T6 among the first to seventh transistors T1 to T7 shown in FIG. 6 will be described for convenience of description.

Referring to FIG. 7, an embodiment of the display device 1 may include the substrate SUB, a pixel circuit layer PCL, and a display element layer DPL.

The substrate SUB may include a rigid material or a flexible material as described above. The flexible material may include at least one selected from polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material of the substrate SUB is not limited to a specific example.

The pixel circuit layer PCL may be located on the substrate SUB.

The pixel circuit layer PCL may include a buffer layer BFL, a gate insulating layer GI, the sixth transistor T6, a first interlayer insulating layer ILD1, a second interlayer insulating layer ILD2, a first conductive line CL1, and a second conductive line CL2.

The buffer layer BFL may be disposed on the substrate SUB. The buffer layer BFL may prevent an impurity from being diffused into the sixth transistor T6.

The buffer layer BFL may include at least one selected from silicon nitride (SiNx), silicon oxide (SiOx), silicon oxynitride (SiOxNy), and metal oxide such as aluminum oxide (AlOx), but the disclosure is not limited thereto.

The sixth transistor T6 may include a semiconductor pattern SCL, a source electrode SE, a drain electrode DE, and a gate electrode GE.

The semiconductor pattern SCL may be located on the buffer layer BFL. At least a portion of the semiconductor pattern SCL may overlap the buffer layer BFL when viewed on a plane or in the third direction DR3.

The semiconductor pattern SCL may be a semiconductor layer. In an embodiment, the semiconductor pattern SCL may include at least one selected from poly-silicon, amorphous silicon, and an oxide semiconductor.

The semiconductor pattern SCL may include a first contact region in contact with the source electrode SE and a second contact region in contact with the drain electrode DE.

The first contact region and the second contact region may correspond to a semiconductor pattern doped with an impurity. A region between the first contact region and the second contact region may be a channel region. The channel region may be an intrinsic semiconductor pattern undoped with the impurity.

The gate insulating layer GI may be disposed over the semiconductor pattern SCL. The gate insulating layer GI may include an inorganic material. In an embodiment, the gate insulating layer GI may include at least one selected from silicon nitride (SiNx), silicon oxide (SiOx), silicon oxynitride (SiOxNy), and aluminum oxide (AlOx). In an embodiment, the gate insulating layer GI may include an organic material.

The gate electrode GE may be located on the gate insulating layer GI. A position of the gate electrode GE may correspond to that of the channel region of the semiconductor pattern SOLO. In one embodiment, for example, the gate electrode GE may be disposed on the channel region of the semiconductor pattern SCL with the gate insulating layer GI interposed therebetween.

The first interlayer insulating layer ILD1 may be located over the gate electrode GE. In an embodiment, the first interlayer insulating layer ILD1 may include at least one selected from silicon nitride (SiNx), silicon oxide (SiOx), silicon oxynitride (SiOxNy), and aluminum oxide (AlOx).

The source electrode SE and the drain electrode DE may be located on the first interlayer insulating layer ILD1. The source electrode SE may be disposed through the gate insulating layer GI and the first interlayer insulating layer ILD1, and be in contact with the first contact region of the semiconductor pattern SCL. The drain electrode DE may be disposed through the gate insulating layer GI and the first interlayer insulating layer ILD1, and be in contact with the second contact region of the semiconductor pattern SCL.

In an embodiment, as shown in FIG. 7, the source electrode SE and the drain electrode DE of the sixth transistor T are individual electrodes which are disposed through the gate insulating layer GI and the first interlayer insulating layer ILD1 and are electrically connected to the semiconductor pattern SCL, but the disclosure is not limited thereto. In an alternative embodiment, the source electrode SE of the sixth transistor T may be one of the first and second contact regions adjacent to the channel region of the semiconductor pattern SCL of the sixth transistor T, and the drain electrode DE of the sixth transistor T may be the other of the first and second contact regions adjacent to the channel region of the semiconductor pattern SCL of the sixth transistor T. In such an embodiment, the drain electrode DE of the sixth transistor T may be electrically connected to a partial component of the display element layer DPL through a separate connection means including a contact electrode, etc.

The second interlayer insulating layer ILD2 may be located over the source electrode SE and the drain electrode DE. In an embodiment, the second interlayer insulating layer ILD2 may include an inorganic material. The inorganic material may include at least one selected from the materials of the first interlayer insulating layer ILD1 and the gate insulating layer GI, e.g., at least one selected from silicon nitride (SiNx), silicon oxide (SiOx), silicon oxynitride (SiOxNy), and aluminum oxide (AlOx). In an embodiment, the second interlayer insulating layer ILD2 may include an organic material.

The first conductive line CL1 may be located on the second interlayer insulating layer ILD2, and be electrically connected to the source electrode SE through a contact hole penetrating the second interlayer insulating layer ILD2.

The second conductive line CL2 may be located on the second interlayer insulating layer ILD2, and be electrically connected to the drain electrode DE through a contact hole defined through the second interlayer insulating layer ILD2.

Each of the first conductive line CL1 and the second conductive line CL2 may be a path through which an electrical signal can flow. In an embodiment, the second conductive line CL2 may be a bridge electrode electrically connecting the drain electrode DE of the sixth transistor T and a partial component of the display element layer DPL. In an embodiment, the first conductive line CL1 and the second conductive line CL2 may include at least one selected from molybdenum (Mo), tungsten (W), aluminum-neodymium (AlNd), titanium (Ti), aluminum (Al), and silver (Ag).

The display element layer DPL may be disposed on the pixel circuit layer PCL. The display element layer DPL may include a protective layer PSV, a pixel defining layer PDL, the organic light emitting element OLED, and a thin film encapsulation layer TFE.

The protective layer PSV may be disposed over the first conductive line CL1 and the second conductive line CL2. The protective layer PSV may be in a form including an organic insulating layer, an inorganic insulating layer, or the organic insulating layer disposed on the inorganic insulating layer.

A first contact hole CH1 may be defined through the protective layer PSV to expose one region of the second conductive line CL2.

The first contact hole CH1 may be a path through which an electrical signal provided from the transistor T is transferred.

The pixel defining layer PDL may function to define an emission area of each pixel PXL. The pixel defining layer PDL may include an organic material. In an embodiment, the pixel defining layer PDL may include at least one selected from acryl resin, epoxy resin, phenolic resin, polyamide resin, and polyimide resin.

The organic light emitting element OLED may include a first electrode AE, an emitting layer EML, and a second electrode CE. The organic light emitting element OLED may be disposed on the protective layer PSV.

One of the first and second electrodes AE and CE may be an anode electrode, and the other of the first and second electrodes AE and CE may be a cathode electrode. In an embodiment where the organic light emitting element OLED is a top-emission organic light emitting element, the first electrode AE may be a reflective electrode, and the second electrode CE may be a transmissive electrode. Hereinafter, for convenience of description, embodiments where the organic light emitting element OLED is the top-emission organic light emitting element, and the first electrode AE is the anode electrode will be described in detail.

The first electrode AE may be located on the protective layer PSV. The first electrode AE may be electrically connected to the second conductive line CL2 through the first contact hole CH1. The first electrode AE may include a reflective layer (not shown) configure to reflect light or a transparent conductive layer (not shown) disposed on the top or the bottom of the reflective layer. In an embodiment, the first electrode AE may have a multi-layer structure include a lower transparent conductive layer including indium tin oxide ("ITO"), a reflective layer which is disposed on the lower transparent conductive layer and includes silver (Ag), and an upper transparent conductive layer which is disposed on the reflective layer and includes ITO. At least one selected from the transparent conductive layer and the reflective layer may be electrically connected to the drain electrode DE of the sixth transistor T6 through the first contact hole CH1.

The emitting layer EML may be disposed in an opening of the pixel defining layer PDL. An area exposed by the opening of the pixel defining layer PDL and/or an area in which the emitting layer EML is disposed may be the emission area in which light is emitted. The emitting area EML may include an organic material.

In an embodiment, the emitting layer EML may have a multi-layered thin film structure including a light generation layer. The emitting layer EML may include a hole injection layer for injecting holes, a hole transport layer having an excellent hole transporting property, the hole transport layer for increasing the opportunity for holes and electrons to be re-combined by suppressing the movement of electrons that fail to be combined in the light generation layer, the light generation layer for emitting light through the re-combination of the injected electrons and holes, a hole blocking layer for suppressing the movement of holes that fail to be combined in the light generation layer, an electron transport layer smoothly transporting electrons to the light generation layer, and an electron injection layer for injecting electrons. In such an embodiment, as described above, when an electrical signal is applied to the emitting layer EML, light may be emitted therefrom. The color of light generated in the emitting layer EML may be one selected from red, green, blue, and white, but not being limited thereto. In one alternative embodiment, for example, the color of light generated in the emitting layer EML may be one selected from magenta, cyan, and yellow.

The second electrode CE may be disposed over the emitting layer EML. The second electrode CE may be in a form of a common electrode disposed on the entire surface of the substrate SUB, but the disclosure is not limited thereto. The second electrode CE may include a transparent conductive material (or substance), for example, a transparent conductive oxide such as TO, indium zinc oxide ("IZO"), aluminum zinc oxide ("AZO"), gallium doped zinc oxide ("GZO"), zinc tin oxide ("ZTO"), gallium tin oxide ("GTO"), indium gallium zinc oxide ("IGZO"), and fluorine doped tin oxide ("FTO"). In an embodiment, where the organic light emitting element OLED is a bottom-emission organic light emitting element, the second electrode CE may include a translucent conductive material (or substance) such as magnesium (Mg), silver (Ag), or an alloy of magnesium (Mg) and silver (Ag).

The thin film encapsulation layer TFE may be located on the second electrode CE. The thin film encapsulation layer TFE may include a plurality of insulating layers covering the organic light emitting element OLED. In an embodiment, the thin film encapsulation layer TFE may include at least one inorganic layer and/or at least one organic layer. In one embodiment, for example, the thin film encapsulation layer TFE may have a structure in which inorganic and organic layers are alternately stacked one on another.

Referring back to FIG. 3, the polarizing film POL may allow light provided from the display panel DP to be transmitted therethrough, and reflect light introduced thereinto from an outside. Accordingly, the polarizing film POL may improve the visibility of the display device 1, and minimize light loss which may occur when light is provided from the organic light emitting element OLED to the outside.

The polarizing film POL may be located in the display area DA when viewed on a plane. The polarizing film POL may be located at the front of the display panel DP. The polarizing film POL may be located on the bottom of the first layer L1.

In accordance with an embodiment, the polarizing film POL may be provided in a form in which a partial area of the polarizing film POL is removed such that the polarizing film POL does not overlap with the chip-on-film COF.

The polarizing film POL will be described in greater detail with reference to FIGS. 8 and 9.

The first adhesive ADL1 may allow the display panel DP and the polarizing film POL to be attached to each other. The first adhesive ADL1 may be a transparent adhesive or a gluing agent, which has high light transmittance. The first adhesive ADL1 may include at least one selected from a resin, an optically clear adhesive, and a pressure sensitive adhesive.

The first layer L1 may be disposed on the polarizing film POL. Herein, the first layer L1 may mean a layer located relatively outer than the polarizing film POL. In an embodiment, where the first layer L1 is implemented with a single layer, the single layer may define the first layer L1. In an alternative embodiment, where the first layer L1 is implemented with a plurality of layers, the plurality of layers may define the first layer L1.

The structure of the first layer L1 will hereinafter be described in greater detail with reference to FIG. 5.

Referring to FIG. 5, in an embodiment, the first layer L1 may include a shock absorbing layer SAL, a protective layer PSL, and a window WD.

The shock absorbing layer SAL may be disposed on the polarizing film POL. The shock absorbing layer SAL may be located on one surface of the polarizing film POL with an adhesive layer interposed therebetween. Although not shown in the drawing, the adhesive layer may allow the shock absorbing layer SAL and the polarizing film POL to be attached to each other, and include at least one material selected from the materials listed above with reference to the first adhesive ADL1.

The shock absorbing layer SAL may reduce physical influence on the display device 1 by absorbing shock from the outside. A crack or the like in at least a partial region, which occurs due to an external force applied to the display device 1, may be prevented.

The shock absorbing layer SAL may have a single layer structure or a multilayer structure. In an embodiment, the shock absorbing layer SAL may include a shock absorbing member. The shock absorbing member may include or be formed of a polymer resin such as polyurethane, polycarbonate, polypropylene or polyethylene, or include a material having elasticity, such as a sponge formed by foaming rubber, a urethane material or an acrylic material. However, the disclosure is not limited thereto.

The protective layer PSL may be located on the shock absorbing layer SAL. The protective layer PSL may be disposed on the shock absorbing layer SAL with an adhesive layer interposed therebetween. The adhesive layer may allow the protective layer PSL and the shock absorbing layer SAL to be connected to each other, and include at least one material selected from the materials listed above with reference to the first adhesive ADL1.

The protective layer PSL may reduce external influence on the display panel DP. In an embodiment, the protective layer PSL may be in a form including an organic insulating layer, an inorganic insulating layer, or the organic insulating layer disposed on the inorganic insulating layer, but the disclosure is not limited thereto.

The shock absorbing layer SAL and the protective layer PSL may improve a mechanical property or mechanical characteristic of the display device 1. The mechanical property or mechanical characteristic may be strength, stiffness, brittleness, toughness, or the like, but the disclosure is not limited thereto.

In an embodiment, as described above, the display device 1 may be a flexible device. In such an embodiment, the display device 1 is desired to have a sufficient mechanical property. In one embodiment, for example, when at least a portion of the display device 1 provided as the flexible device is bent, a predetermined stress may occur with respect to an individual layer of the display device 1. When the sufficient mechanical property is not ensured, the portion may be cut, or a crack may occur in the portion. In an embodiment, the shock absorbing layer SAL and the protective layer PSL are provided, such that the mechanical influence described above may be reduced.

The window WD may be located on the protective layer PSL. The window WD may be disposed on the protective layer PSL with an adhesive layer interposed therebetween. The adhesive layer may allow the window WD and the protective layer PSL to be attached to each other. The adhesive layer may include at least one material selected from the materials listed above with reference to the first adhesive ADL1.

The window WD may reduce external influence on the display panel DP. The window WD reduces an external impact while allowing light provided from the display panel DP to be transmitted therethrough, so that the display device 1 may be prevented from being damaged or malfunctioned due to the external impact.

The window WD may include glass or quartz. In an example, the window WD may include ultra thin glass.

In accordance with an embodiment, the display device 1 may further include a second layer L2. Referring to FIG. 4, the second layer L2 may be located on one surface of the polarizing film POL, on which the first layer L1 is not located. That is, the polarizing film POL may be disposed between the first layer L1 and the second layer L2. Herein, the second layer L2 is a layer disposed on a rear surface of the polarizing film POL, and may mean a layer located between the display panel DP and the polarizing film POL.

Similarly to the first layer L1, the second layer L2 may be implemented with a single layer or a plurality of layers. In an embodiment, where the second layer L2 is implemented with a single layer, the second layer L2 may be defined by the single layer. In an alternative embodiment, where the second layer L2 is implemented with a plurality of layers, the second layer L2 may be defined by the plurality of layers.

The second layer L2 may include at least one selected from the shock absorbing layer SAL and the protective layer PLS. In such an embodiment, the second layer L2 may improve the mechanical property of the display device 1.

Hereinafter, the polarizing film POL will be described in detail with reference to FIGS. 8 and 9.

Figure 8:
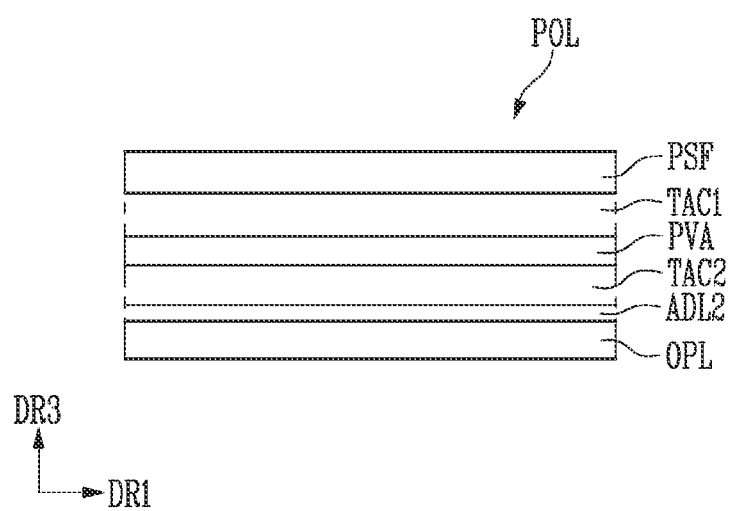
FIG. 8 is a sectional view of a polarizing film included in the display device in accordance with an embodiment of the disclosure.

FIG. 8 is a sectional view of a polarizing film included in the display device in accordance with an embodiment of the disclosure.

Referring to FIG. 8, the polarizing film POL may include a polarizer PVA, a first tri-acetyl cellulose ("TAC") film TAC1, a second TAC film TAC2, a protective film PSF, and an optical layer OPL.

The polarizer PVA may have a polarizing axis, and polarize light in a direction vertical to the polarizing axis. In one embodiment, for example, the polarizer PVA may absorb the light which coincides with the polarizing axis, and allow light vertical to the polarizing axis to pass therethrough. Therefore, when light passes through the polarizer PVA, the light may be linearly polarized in a direction vertical to the polarizing axis.

The polarizer PVA may be configured with a layer in which dichroic dye is oriented by adsorption on uniaxially elongated polyvinyl alcohol-based resin film. The polyvinyl alcohol-based resin film may be denaturalized, and polyvinyl formal, polyvinyl acetal, polyvinyl butyral, etc., which have been denatured as aldehydes may be used, for example. The dichroic dye may be, for example, iodine, organic dye, etc.

The polarizer PVA may include a polyvinyl alcohol-based film, a polypropylene-based film, etc., a layer formed by coating, a metal pattern layer such as a wire grid polarizer WGP, etc.

The first TAC film TAC1 and the second TAC film TAC2 may be respectively disposed on two opposite surfaces of the polarizer PVA, respectively, to support and protect the polarizer PVA.

Each of the first TAC film TAC1 and the second TAC film TAC2 may be a resin film. The first TAC film TAC1 and the second TAC film TAC2 may include a cellulose-based resin such as triacetyl cellulose, a cyclo olefin-based resin such as norbornene-based resin, an olefin-based resin such as polyethylene or polypropylene, polyester-based resin, (met) acryl-based resin, etc.

The protective film PSF may be disposed on the first TAC film TAC1. The protective film PSF may prevent surface damage of the polarizer PVA.

The protective film PSF may include an adhesive. In an embodiment, the adhesive may be a solvent adhesive, an emulsion adhesive, a pressure sensitive adhesive, a solvent free adhesive, an adhesive on a film, or a hot-melt adhesive. Alternatively, the adhesive may be a waterborne adhesive of which a base material of the adhesive is dissolved or distributed in water, but the disclosure is not limited to a specific example.

The optical layer OPL may be located on the second TAC film TAC2 with a second adhesive ADL2 interposed therebetween. The second adhesive ADL2 may include or be made of at least one material selected from the material listed above with reference to the first adhesive ADL1, but the disclosure is not limited a specific example.

The optical layer OPL may selectively allow applied light to be selectively transmitted therethrough or reflected therefrom by retarding the applied light. In an embodiment, the optical layer OPL may selectively allow light provided from the display panel DP or the polarizer PVA to be selectively transmitted therethrough or reflected therefrom.

In accordance with an embodiment, the optical layer OPL may include at least one selected from a λ/4 phase retardation layer and a λ/2 phase retardation layer. The λ/4 phase retardation layer may retard the phase of applied light by a λ/4 phase. The λ/2 phase retardation layer may retard the phase applied light by a λ/4 phase.

The optical layer OPL may include a coating base film such as cholesteric liquid crystal.

Figure 9:
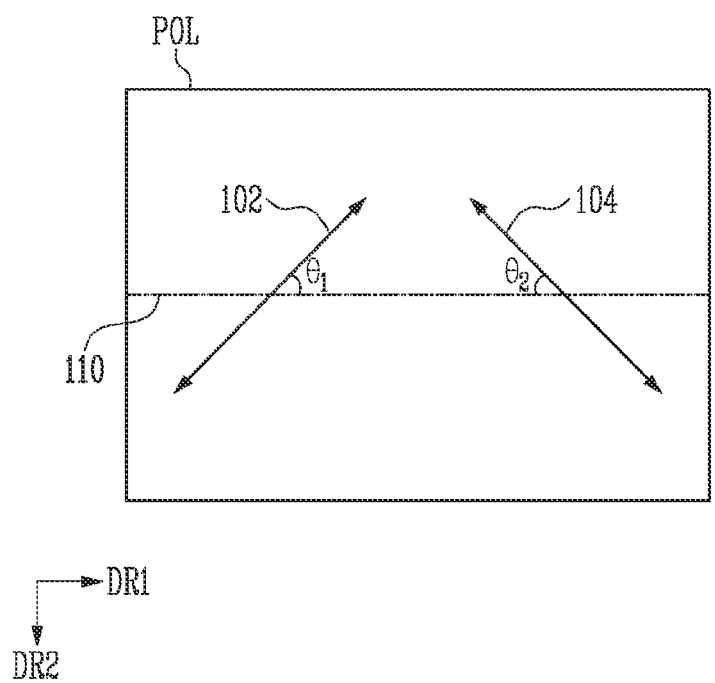
FIG. 9 is a plan view illustrating a polarizing film included in the display device in accordance with an embodiment of the disclosure.

FIG. 9 is a plan view illustrating a polarizing film included in the display device in accordance with an embodiment of the disclosure.

Referring to FIG. 9, the polarizing film POL may have a first reference line 110, a first absorption axis 102 forming a predetermined angle with the first reference line 110, and a first transmission axis 104 orthogonal to the first absorption axis 102.

The polarizing film POL may allow light parallel to the first absorption axis 102 not to be transmitted therethrough, and allow light parallel to the first transmission axis 104 to be transmitted therethrough.

The first reference line 110 may be an imaginary line parallel to the polarizing axis of optical image provided from the display panel DP. In such an embodiment, light provided from the display panel DP may have a polarizing axis formed in a predetermined direction according to a predetermined reference, and the polarizing axis may become a reference line defining an angle of the first absorption axis 102 or the first transmission axis 104 of the polarizing film POL.

The first absorption axis 102 may form a first angle $\theta_1$ with the first reference line 110 of the polarizing film POL. The first absorption axis 102 and the first reference line 110 may have an angle therebetween of the first angle $\theta_1$. The first angle $\theta_1$ may be about 45 degrees. Alternatively, the first angle $\theta_1$ may be in a range of about 25 degrees to about 65 degrees.

The first transmission axis 104 may form a second angle $\theta_2$ with the first reference line 110 of the polarizing film POL. The first transmission axis 104 and the first reference line 110 may have an angle therebetween of the second angle $\theta_2$. The second angle $\theta_2$ may be about 45 degrees. Alternatively, the second angle $\theta_2$ may be in a range of about 25 degrees to about 65 degrees. A first absorption axis 102 may extend a first direction and a first transmission axis 104 may extend a second direction orthogonal to the first direction.

Hereinafter, an improved optical inspection reliability of an embodiment of the display device 1 will be described in detail.

'Optical inspection' defined herein may mean that operational performance of the display device 1 is inspected based on an optical image provided from the display device 1. That is, the 'optical inspection' relates to an inspection action determined based on the optical image output from the display device 1, and is not limited to a specific inspection action.

In an embodiment, the first layer L1 may be located on the top of the polarizing film POL as described above.

However, when the first layer L1 is located on the polarizing film POL (particularly, the first layer L1 is configured with a plurality of layers), the optical property of light applied from the display panel DP may be changed by an optical phenomenon including refraction or reflection in a process of allowing light to be transmitted through the first layer L1.

In a process of allowing light having a first wavelength to be transmitted through the first layer L1, for example, the light may be changed to light having a second wavelength different from the first wavelength and then output to the outside. As a result, optical data provided to a front surface of the display device 1 may include distorted image information different from intended image information and then output. Alternatively, a color deviation of light applied from the display panel DP may occur. The color deviation may be information representing a difference between color data observed at a specific viewing angle and color data observed at a viewing angle different from the specific viewing angle.

Furthermore, when the display device 1 further includes the second layer L2, light applied from the display panel DP is transmitted through the first layer L1 and the second layer L2 and then output to the outside, and the above-described optical problem may occur in the transmission process.

In an embodiment, the phase difference of a layer constituting the display device 1 may be adjusted to prevent the above-described conventional problem from occurring.

Figure 10:
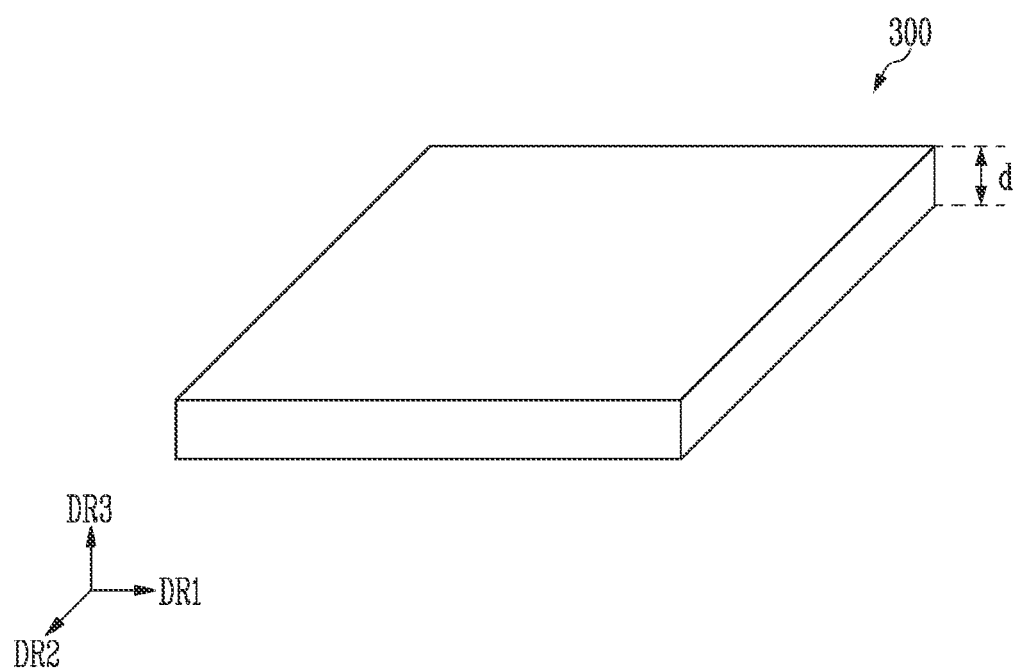
FIG. 10 is a perspective view illustrating a target layer to describe a definition of a phase difference.

The 'phase difference' defined herein may mean an in-plane phase difference of a target layer 300 (shown in FIG. 10). Hereinafter, a definition of the phase difference will be described with reference to FIG. 10. FIG. 10 is a perspective view illustrating a target layer 300 to describe a definition of the phase difference.

The target layer 300 may be at least one of layers described herein. The in-plane phase difference may be a parameter defined as a multiplication of a difference between refractive indices of different axes orthogonal to each other in a plane of the target layer 300 and a film thickness d.

Referring to FIG. 10, for example, the different axes orthogonal to each other in the plane of the target layer 300 may correspond to the first direction DR1 and the second direction DR2. In this case, a phase difference in the plane of the target layer 300 may be defined as '$|N_{DR1}-N_{DR2}| \times d$.' $N_{DR1}$ denotes a refractive index of the target layer 300 with respect to the first direction DR1, and $N_{DR2}$ denotes a refractive index of the target layer 300 with respect to the second direction DR2.

In accordance with an embodiment, each of the layers constituting the display device 1 may have a predetermined phase difference.

The first layer L1 may have a first phase difference. The first phase difference which means a phase difference of the first layer L1 may mean a total sum of phase differences of the respectively layers constituting the first layer L1.

In an embodiment, the first layer L1 may have the shock absorbing layer SAL, the protective layer PSL, and the window WD as described with reference to FIG. 5. The shock absorbing layer SAL may have a first first phase difference, the protective layer PSL may have a second first phase difference, and the window WD may have a third first phase difference. The sum of the first first phase difference, the second first phase difference, and the third first phase difference may be equal to the first phase difference. However, the disclosure is not limited thereto. When an additional layer is included in the first layer L1 in addition to the layers described with reference to FIG. 5, the total sum of phase differences of the respective layers included in the first layer L1 may mean the first phase difference.

The first phase difference may be in a predetermined numerical range. The first phase difference may be less than about 10 nanometers (nm). Alternatively, the first phase difference may equal to or greater than about 110 nm and equal to or less than about 160 nm. Alternatively, the first phase difference may be greater than about 4000 nm.

As described above with reference to FIG. 4, in an embodiment, the display device 1 may further include the second layer L2.

The second layer L2 may have a second phase difference. In an embodiment where the second layer L2 is implemented with a single layer, the second phase difference may mean a phase difference of the second layer L2. In an alternative embodiment, where the second layer L2 is implemented with a plurality of layers, the second phase difference may mean the sum of phase differences of the respective layers constituting the second layer L2.

In such an embodiment, the sum of the first phase difference representing the phase difference of the first layer L1 and the second phase difference representing the phase difference of the second layer L2 may correspond to a predetermined numerical range.

The sum of the first phase difference and the second phase difference may be less than about 10 nm. Alternatively, the sum of the first phase difference and the second phase difference may be equal to or greater than about 110 nm and equal to or less than about 160 nm. Alternatively, the sum of the first phase difference and the second phase difference may be greater than about 4000 nm.

In an embodiment, a phase difference total sum of the first layer L1 and/or the second layer L2 is controlled in the above-described numerical range while an angle of the first absorption axis 102 or the first transmission axis 104 is controlled in the above-described numerical range, such that distortion of information on light applied from the display panel DP may be effectively prevented, and accordingly, the color deviation of light provided from the front surface of the display device 1 may be reduced.

Hereinafter, an optical inspection method of the display device in accordance with an embodiment of the disclosure will be described in detail with reference to FIGS. 11 to 13.

Figure 11:
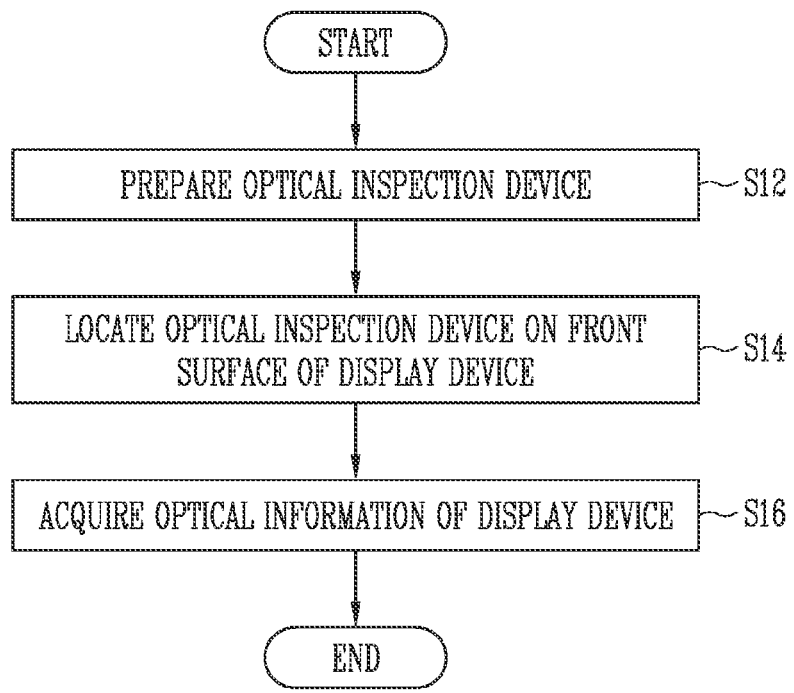
FIG. 11 is a flowchart illustrating an optical inspection method in accordance with an embodiment of the disclosure.

FIG. 11 is a flowchart illustrating an optical inspection method in accordance with an embodiment of the disclosure. FIG. 12 is a view briefly illustrating an optical inspection process in accordance with an embodiment of the disclosure. FIG. 13 is a plan view illustrating a polarizing part included in an optical inspection device used in the optical inspection method in accordance with an embodiment of the disclosure.

Referring to FIG. 11, an embodiment of the optical inspection method of the display device 1 may include preparing an optical inspection device (S12), locating the optical inspection device on the front surface of the display device (S14), and acquiring optical information of the display device (S16).

In a process of the preparing optical inspection device (S12), an optical inspection device 20 and the display device 1 may be provided. The optical inspection device 20 may be a camera device configured to acquire image information.

Figure 12:
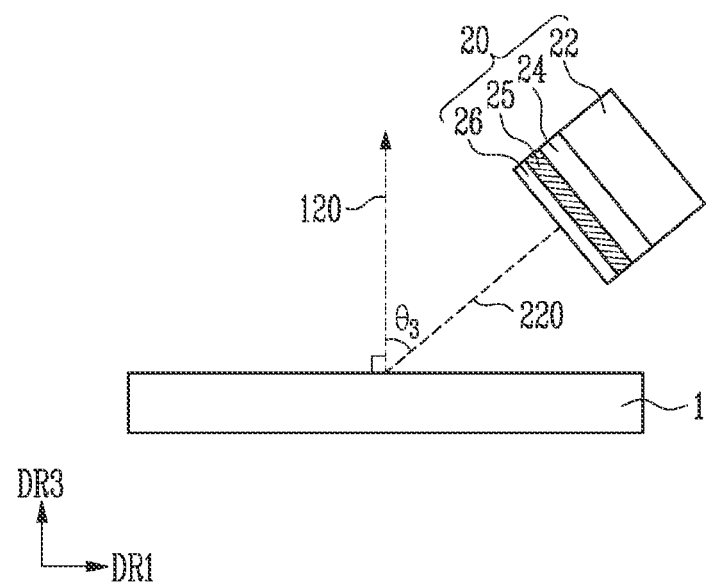
FIG. 12 is a view briefly illustrating an optical inspection process in accordance with an embodiment of the disclosure.

Referring to FIG. 12, the optical inspection device 20 may include a main body 22, a lens part 24, a phase film part 25, and a polarizing part 26.

The main body 22 may include an optical sensor part configure to receive light provided from the lens part 24 and acquiring electrical information, based on information on the provided light and a housing defining the appearance of the optical inspection device 20.

The optical sensor part may be implemented as a central processing unit ("CPU") or a device similar thereto according to hardware, software, or a combination thereof. The optical sensor part may be a light receiving part configured to receive light. The optical sensor part may include a polarizer having a predetermined polarizing axis, and acquire information on light polarized by the polarizer.

In an embodiment, the main body 22 may include a memory part configure to store the acquired electrical information or a communication part configure to transmit the acquired electrical information to an external computing device.

The lens part 24 may receive optical information on a target object, and provide the provided optical information to the main body 22. In one embodiment, for example, the lens part 24 may be in a lens shape to allow image information applied from a photographing object to advance into the main body 22 along a predetermined optical path. The image information provided to the lens part 24 may be image information including an optical characteristic changed by the polarizing part 26.

The phase film part may be located on a top surface or a bottom surface of the lens part 24. In one embodiment, for example, the phase film part 25 may be disposed between the polarizing part 26 and the lens part 24, or be disposed between the main body 22 and the lens part 24. The phase film part 25 may include a plurality of layers, each having a predetermine phase difference, or be implemented with a single layer.

The phase film part 25 may have a phase difference of about 4000 nm or greater. In one embodiment, for example, when the phase film part 25 is implemented with a single layer, the single layer may have a phase difference of about 4000 nm or greater. Alternatively, when the phase film part 25 is implemented with a plurality of layers, a total sum of phase differences of the respective layers may be about 4000 nm or greater.

The polarizing part 26 may allow light provided to the optical inspection device 200 to be transmitted therethrough, and reflect light introduced from the outside. In one embodiment, for example, referring to FIG. 12, the polarizing part 26 may allow an image provided from the display device 1 to be transmitted therethrough. The polarizing part 26 may include a polarizing film. The polarizing part 26 may have a structure substantially identical to that of the polarizing film POL of the above-described display device 1.

The polarizing part 26 may be disposed on an outer surface of the optical inspection device 20 configure to receive light from the outside, but the disclosure is not limited thereto. In an embodiment, the polarizing part 26 may be located on the top surface or the bottom surface of the lens part 24.

Figure 13:
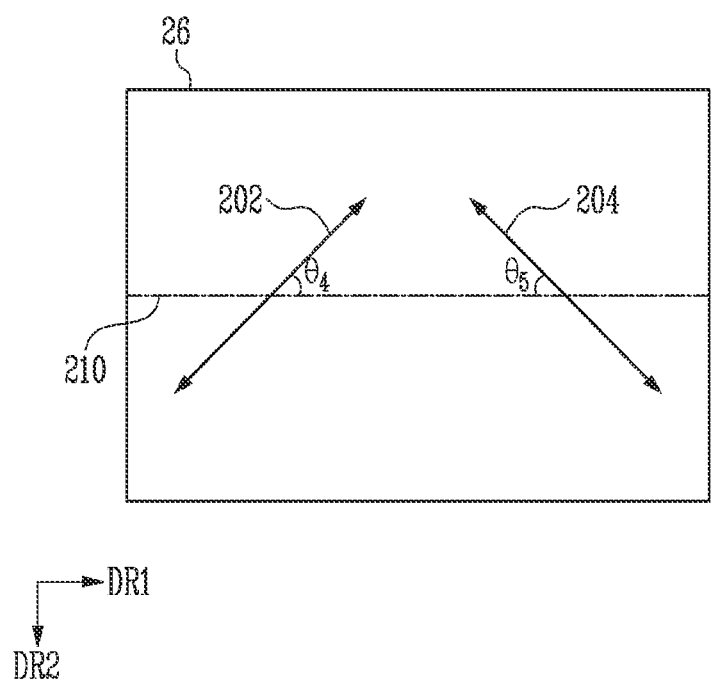
FIG. 13 is a plan view illustrating a polarizing part included in an optical inspection device used in the optical inspection method in accordance with an embodiment of the disclosure.

Referring to FIG. 13, the polarizing part 26 may have a second reference line 210, a second absorption axis 202 forming a predetermined angle with the second reference line 210, and a second transmission axis 204 orthogonal to the second absorption axis 202.

The polarizing part 26 may allow light parallel to the second absorption axis 202 not to be transmitted therethrough, and allow light parallel to the second transmission axis 204 to be transmitted therethrough.

The second reference line 210 may represent an imaginary line corresponding to the polarizing axis of the polarizer included in the optical sensor part. The second reference line 210 may be parallel to the polarizing axis of the polarizer included in the optical sensor part.

The second absorption axis 202 may form a fourth angle $\theta_4$ with the second reference line 210. The second absorption axis 202 and the second reference line 210 may have an angle therebetween of the fourth angle $\theta_4$. The fourth angle $\theta 4$ may be about 45 degrees. Alternatively, the fourth angle $\theta_4$ may be in a range of about 25 degrees to about 65 degrees.

The second transmission axis 204 may form a fifth angle $\theta_5$ with the second reference line 210. The second transmission axis 204 and the second reference line 210 may have an angle therebetween of the fifth angle $\theta_5$. The fifth angle $\theta_5$ may be about 45 degrees. Alternatively, the fifth angle $\theta_5$ may be in a range of about 25 degrees to about 65 degrees.

Referring back to FIGS. 11 and 12, in a process of the locating the optical inspection device on the front surface of the display device (S14), the optical inspection device 20 may be disposed on the front surface of display device 1.

In the process of the locating the optical inspection device on the front surface of the display device (S14), the optical inspection device 20 may be disposed at a predetermined position with respect to a display direction of the display device 1 to acquire optical data provided from the display device 1.

In one embodiment, for example, the optical inspection device 20 may be disposed such that a reference display line 120 and a reference light receiving line 220 form a third angle $\theta_3$.

The reference display line 120 may mean the display direction. The reference display line 120 may be a direction perpendicular to a display surface of the display device 1. The display surface means a surface from which light is emitted, and may mean an outer surface of the display area DA described with reference to FIG. 1. In an embodiment, the display surface may mean a light emission direction facing the third direction DR3 from the display device 1.

The reference light receiving line 220 may mean an imaginary line perpendicular to a main surface of the optical inspection device 20. The reference light receiving line 220 may mean an imaginary line perpendicular to a main surface of the polarizing part 26 or the lens part 24.

In the process of the locating the optical inspection device on the front surface of the display device (S14), the optical inspection device 20 may be disposed with respect to the display device 1 in a way such that the third angle $\theta_3$ becomes about 45 degrees. Alternatively, the optical inspection device 20 may be disposed at a predetermined position with respect to the display device 1 such that the third angle $\theta_3$ becomes in a range of about 20 degrees to about 65 degrees.

In a process of the acquiring the optical information of the display device (S16), optical information may be acquired based on light output from the display device 1.

In the process of the acquiring the optical information of the display device (S16), an image processor provided in the main body 22 may acquire electrical information, based on the light provided from the display device 1. In one embodiment, for example, when first light is displayed at a first spot of the display area DA of the display device 1 and second light is displayed at a second spot of the display area DA, the image processor may output an electrical signal including information that the first light has been displayed at the first spot and information that the second light has been displayed at the second spot.

In an embodiment, as described above, the phase film part 25 included in the optical inspection device 20 has a phase difference of about 4000 nm or greater, and the second absorption axis 202 or the second transmission axis 204 of the polarizing part 26 has an angle of about 45 degrees or in a range of about 25 degrees to about 65 degrees. Thus, distortion of image information provided when an optical performance test on the display device 1 is performed may be reduced, and a color deviation can be decreased. Accordingly, the optical inspection reliability of the display device 1 can be improved.

In accordance with embodiments of the disclosure, a display device and an optical inspection method for the display device may have improved reliability of optical information.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An optical inspection method comprising:
preparing a display device including a light emitting element which emits light, wherein the display device outputs the light in a display direction;
preparing an optical inspection device which receives the light output from the display device;
locating the optical inspection device on a front surface of the display device; and
acquiring optical information of the display device, based on the light provided from the display device,
wherein the optical inspection device includes:
a main body including a light receiving part which receives light provided thereto, wherein the light receiving part includes a polarizer having a predetermined polarizing axis, and an image processor which acquires electrical information, based on the light provided to the light receiving part;
a lens part which receives light provided from an outside, wherein the lens part provides the light provided from the outside to the light receiving part; and
a phase film part having a phase difference of about 4000 nm,
wherein the optical inspection device includes a polarizing part having an absorption axis and a transmission axis, and
wherein an angle between the predetermined polarizing axis of the polarizer and one of the absorption axis and the transmission axis is in a range of about 25 degrees to about 65 degrees.

2. The optical inspection method of claim 1, wherein the locating the optical inspection device on the front surface of the display device comprises locating the optical inspection device at the front of the display device in a way such that a reference display line of the display device and a reference light receiving line of the optical inspection device form an angle of about 45 degrees, and
wherein the reference display line is perpendicular to a display surface of the display device, and
the reference light receiving line is perpendicular to a main surface of the optical inspection device.

* * * * *